United States Patent
Haga

(10) Patent No.: US 9,780,245 B2
(45) Date of Patent: *Oct. 3, 2017

(54) SOLAR BATTERY MODULE

(75) Inventor: Takahiro Haga, Izumisano (JP)

(73) Assignee: PANASONIC INTELLECTUAL PROPERTY MGMT CO., LTD., Osaka-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/879,431

(22) Filed: Sep. 10, 2010

(65) Prior Publication Data

US 2011/0000523 A1    Jan. 6, 2011

Related U.S. Application Data

(62) Division of application No. 10/875,498, filed on Jun. 25, 2004.

(30) Foreign Application Priority Data

Jun. 27, 2003    (JP) .................................. 2003-185929

(51) Int. Cl.
*H01L 31/044* (2014.01)
*H01L 31/054* (2014.01)
(Continued)

(52) U.S. Cl.
CPC ........ *H01L 31/0547* (2014.12); *H01L 31/048* (2013.01); *H01L 31/0512* (2013.01); *Y02B 10/12* (2013.01); *Y02E 10/52* (2013.01)

(58) Field of Classification Search
CPC ........ H01L 31/00–31/078; Y02E 10/50–10/60
(Continued)

(56) References Cited

U.S. PATENT DOCUMENTS 4,287,382 A   9/1981 French
4,311,869 A   1/1982 Kurth et al.
(Continued)

FOREIGN PATENT DOCUMENTS

EP   0893833 A2   1/1999
JP   57-12567 A   1/1982
(Continued)

OTHER PUBLICATIONS

European Search Report dated Jul. 12, 2007, issued in corresponding European Patent Application No. 04253713.4.
(Continued)

*Primary Examiner* — Bach Dinh
(74) *Attorney, Agent, or Firm* — Westerman, Hattori, Daniels & Adrian, LLP

(57) ABSTRACT

It is an object of the present invention to easily and inexpensively provide a structure of effectively utilizing a light incident on an invalid area of a solar cell. Moreover, it is another object to improve output characteristics of the solar cell by effectively utilizing the light. The gist of the present invention resides in a solar battery module in which plate-like solar cells are held between a light penetrable sheet member on a light receiving surface side and a sheet member on a back surface side, and internal apertures are filled with a sealing resin, wherein a light diffusion section for diffusely reflecting a light or a light diffusion section of a white color is arranged in an invalid region of each solar cell.

21 Claims, 4 Drawing Sheets

(51) Int. Cl.
*H01L 31/048* (2014.01)
*H01L 31/05* (2014.01)

(58) Field of Classification Search
USPC .................................................. 136/242–265
See application file for complete search history.

(56) References Cited

U.S. PATENT DOCUMENTS

| | | | |
|---|---|---|---|
| 4,336,648 A * | 6/1982 | Pschunder et al. ............ 438/64 |
| 4,443,652 A | 4/1984 | Izu et al. |
| 4,487,989 A | 12/1984 | Wakefield et al. |
| 4,631,351 A | 12/1986 | Tawada et al. |
| 4,697,041 A | 9/1987 | Okaniwa et al. |
| 5,011,544 A | 4/1991 | Gaddy et al. |
| 5,180,686 A * | 1/1993 | Banerjee et al. ............ 438/62 |
| 5,279,686 A | 1/1994 | Nishida |
| 5,468,988 A | 11/1995 | Glatfelter et al. |
| 5,726,006 A | 3/1998 | Gourlaouen et al. |
| 5,998,729 A * | 12/1999 | Shiomi et al. ............... 136/251 |
| 6,008,449 A | 12/1999 | Cole |
| 6,323,415 B1 * | 11/2001 | Uematsu et al. ............ 136/246 |
| 6,479,744 B1 | 11/2002 | Tsuzuki et al. |
| 6,515,217 B1 | 2/2003 | Aylaian |
| 6,613,603 B1 | 9/2003 | Sano |
| 2001/0011551 A1 * | 8/2001 | Peumans et al. ............ 136/246 |
| 2001/0023702 A1 | 9/2001 | Nakagawa et al. |
| 2002/0038663 A1 * | 4/2002 | Zenko et al. ............... 136/244 |
| 2002/0056473 A1 * | 5/2002 | Chandra et al. ............ 136/256 |
| 2002/0185170 A1 | 12/2002 | Shiotsuka et al. |
| 2002/0190643 A1 * | 12/2002 | Cummings et al. .......... 313/553 |
| 2004/0008440 A1 * | 1/2004 | Bonicel ........................ 359/896 |
| 2004/0154658 A1 | 8/2004 | Tanaka et al. |
| 2005/0046331 A1 * | 3/2005 | Kim et al. .................... 313/493 |

FOREIGN PATENT DOCUMENTS

| | | |
|---|---|---|
| JP | 61226972 A | 10/1986 |
| JP | 1-308178 A | 12/1989 |
| JP | 09-260696 A | 10/1997 |
| JP | 10-093117 A | 4/1998 |
| JP | 11-298029 A | 10/1999 |
| JP | 11-307791 A | 11/1999 |
| JP | 11-307795 A | 11/1999 |
| JP | 2003-37281 A | 2/2003 |

OTHER PUBLICATIONS

Japanese Office Action dated Apr. 7, 2009, issued in corresponding Japanese Patent Application No. 2003-185929.
Chinese Office Action dated Dec. 7, 2007, issued in corresponding Chinese Application No. 2004-100453224.
Japanese Office Action dated Dec. 22, 2008 issued in corresponding Japanese Patent Application No. 2003-185929.
S. Tachibana, et al., "Concentrater Single Crystal PV Moduce", Sharp Gihou (Sharp Corporation Technical Report), Sharp Corporation, Nara, Japan,, Apr. 1998, pp. 69-70, No. 70, (English language translation of marked-up portion enclosed).
R. Preu, et al.,"Optimisation of Cell Interconnectors for PV Module Performance Enhancement", pp. 278-281; 1997.
Notice of Allowance issued on Oct. 26, 2012, in corresponding Japanese Patent Application No. 2009-036572 and English translation thereof (6 pages).
Last Amendment before Notice issued in corresponding Japanese Patent Application No. 2009-036572 and English translation thereof (8 pages).
Communication pursuant to Article 94(3) EPC dated Mar. 5, 2015, issued in corresponding European Application No. 04 253 713.4 (5 pages).
Extended European Search Report dated May 20, 2016, issued in European Application No. 12150172.0 (8 pages).

* cited by examiner

SOLAR BATTERY MODULE

CROSS-REFERENCE TO RELATED APPLICATION

This application is a divisional application of U.S. Ser. No. 10/875,498, filed Jun. 25, 2004, which is based upon and claims the benefit of priority from prior Japanese Patent Application No. 2003-185929, filed Jun. 27, 2003, the entire contents of all of which are incorporated herein by reference.

BACKGROUND OF THE INVENTION

The present invention relates to a solar battery module.

Japanese Patent Application Laid-Open No. 10-93117 discloses a structure regarding a conventional solar cell. In a collecting electrode on the solar cell, a side surface is formed as a tilting surface to reflect an incident light toward a light receiving surf ace. Accordingly, the collecting electrode is arranged in an invalid region on the solar cell, and a light incident on this invalid region is put to effective use.

In the conventional solar cell, inexpensive formation of a collecting electrode which has a tilting surface has been difficult in terms of a manufacturing process and used materials.

SUMMARY OF THE INVENTION

The present invention has been made to solve the foregoing problem, and it is an object of the invention to easily and inexpensively provide a structure of effectively utilizing a light incident on an invalid area of a solar cell.

The present invention is directed to a solar battery module in which plate-like solar cells are held between a light penetrable sheet member on a light receiving surface side and a sheet member on a back surface side, and internal apertures are filled with a sealing resin, wherein a light diffusion section for diffusely reflecting a light or a light diffusion section of a white color is arranged in an invalid region of each solar cell.

DETAILED DESCRIPTION OF THE PREFERRED EMBODIMENT

Figure 1:
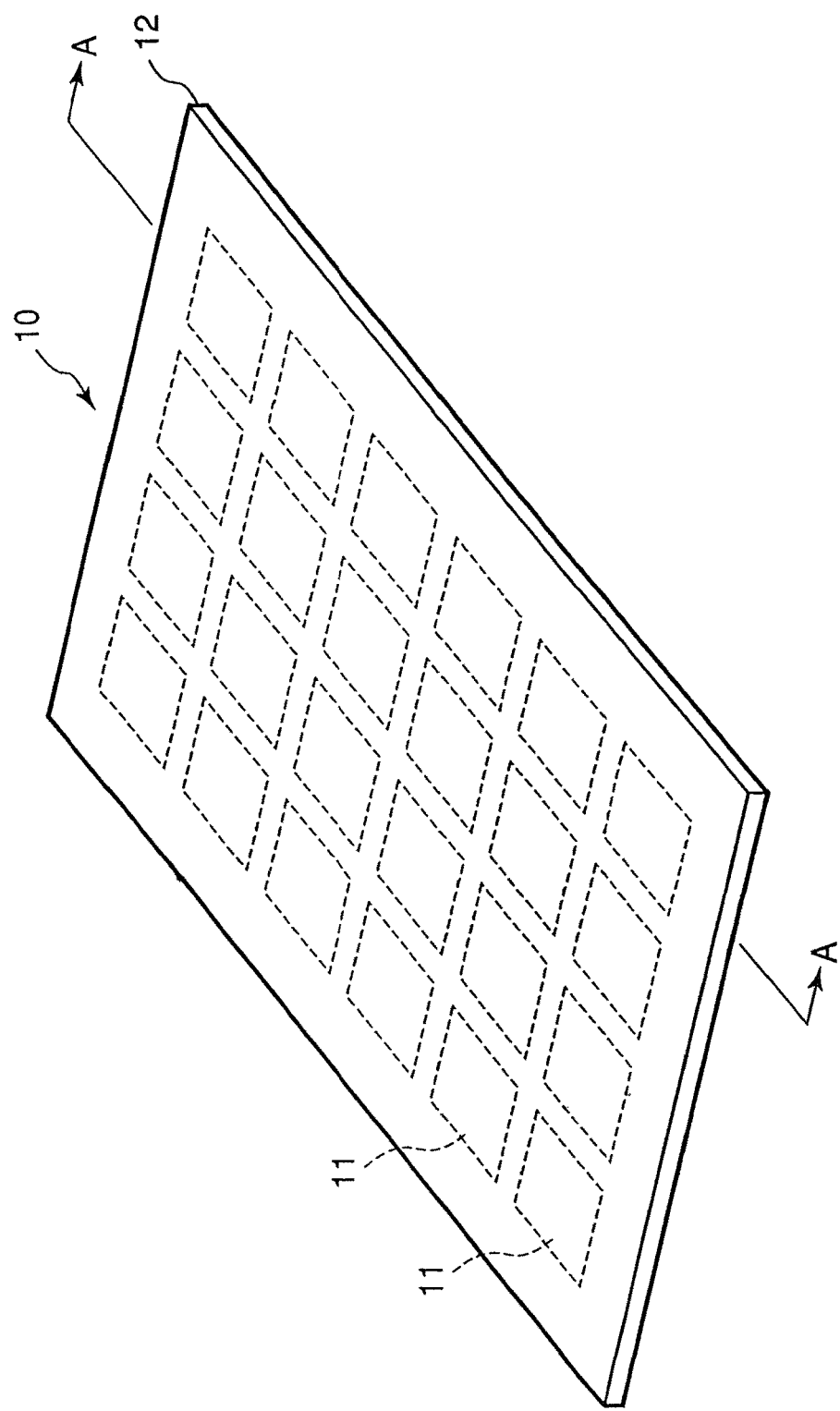
FIG. 1 is a perspective view showing an embodiment of the present invention.
Figure 2:
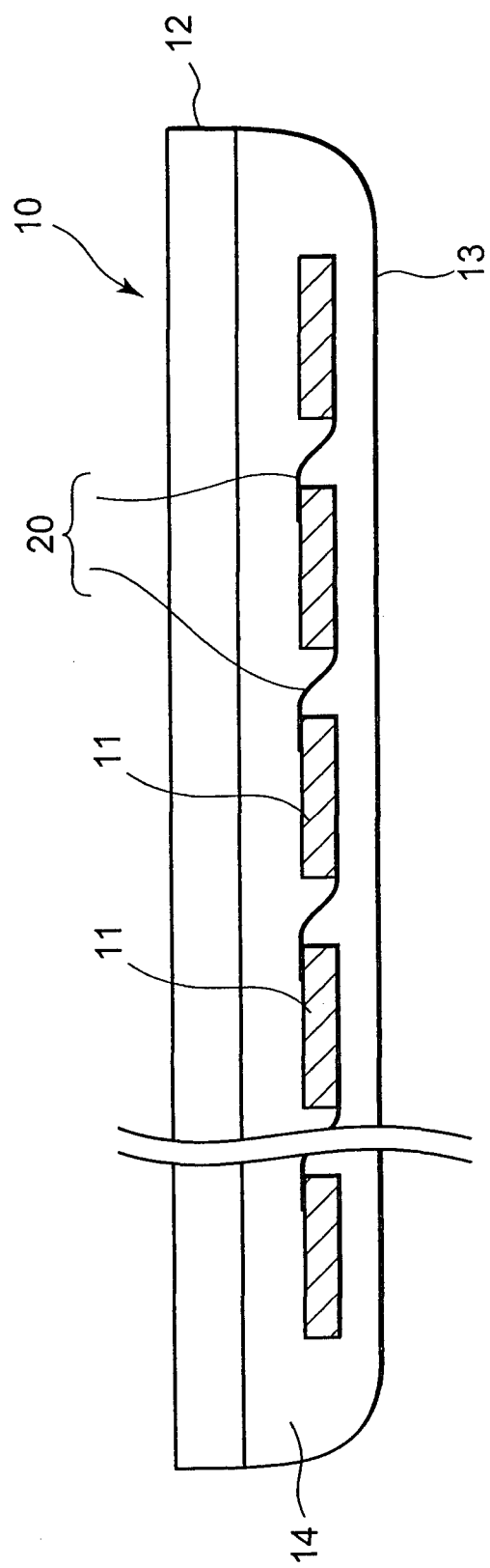
FIG. 2 is a sectional view cut along the line A-A of FIG. 1.

Next, an embodiment of the present invention will be described in detail with reference to FIGS. 1 to 4. Among the drawings, FIG. 1 is a perspective view of a solar battery module, and FIG. 2 is a main portion sectional view cut along the line A-A of FIG. 1. In FIG. 1, the solar battery module 10 has a roughly rectangular plate form, and comprises a light penetrable sheet member 12 such as glass on a light receiving surface side, and a sheet member 13 such as a fluororesin or PET resin film (thickness of about 40 to 50 μm) on a back surface side.

A plurality of plate-like solar cells 11 rectangular in shape when seen from a plane are arranged at intervals in an adjacent and fixed state by a light penetrable sealing resin 14 fully supplied between the light penetrable sheet member 12 and the sheet member 13.

Regarding a method and a structure for sealing the plurality of solar cells 11, the sheet sealing resin 14 is arranged among the light penetrable sheet member 12, the solar cells 11, and the sheet member 13 before pressure vacuum heating of ethylene-vinylacetate (EVA) or the like. In this arranged state, the sealing resin 14 is subjected to pressure vacuum heating from front and back surfaces of a solar battery module 10 to be softened. Then, the sealing resin 14 fills internal apertures to complete a structure of FIG. 2.

As the solar cell 11, a silicon single-crystal or polycrystal solar cell can be used. Incidentally, according to the embodiment, for the solar cell 11, a structure of a double-surface power generation type capable of generating power on front and back surfaces is used, which comprises a transparent conductive film, a p-type amorphous semiconductor film, an i-type amorphous semiconductor film, an n-type crystal semiconductor substrate, an i-type amorphous semiconductor film, an n-type amorphous semiconductor film, and a transparent conductive film from the front surface side.

In such a solar cell 11, a laminated structure of at least the transparent conductive film, the p-type amorphous semiconductor film and the i-type amorphous semiconductor-film on the front surface side is disposed inwardly as much as a certain distance along a full outer periphery of the n-type crystal semiconductor substrate. As just described, an area of the laminated structure on the light receiving surface side is smaller in order to prevent an inconvenience that the laminated structure on the front surface side, and a laminated structure of the i-type amorphous semiconductor film, the n-type amorphous semiconductor film and the transparent conductive film on the back surface side get into a side of the n-type crystal semiconductor substrate, adhere thereto, and come in. contact with each other to become a short circuit state. during a manufacturing process. Therefore, an outer peripheral invalid region 1 (see FIG. 3) which does not contribute to power generation is positioned on the outer periphery on the light receiving surface side of the solar cell 11.

Additionally, a collecting electrode 16 made of a silver paste or the like is arranged on the light receiving surface and the back surface side of the solar cell 11. A plan view seen from the back surface side of the solar cell 11 is similar to the plan view (=FIG. 3) seen from the front surface side, and hence, it is not shown.

As shown, the collecting electrode 16 comprises two bus electrode sections 15 (width of about 2 mm) extending in parallel with sides, and a plurality of finger electrode sections 18 (width of about 50 μm, interval of about 2 to 3 mm) extending orthogonally to the bus electrode sections 15. The invalid region that makes no contribution to power generation is positioned below such a collecting electrode 16.

In FIG. 1. the adjacent solar cells 11 are electrically connected by a connection member 20 prepared by dipping solder in metal foil, e.g. copper foil. Specifically, one end side of the connection member 20 is connected through a solder layer (not shown) to the bus electrode section 15 of the collecting electrode 16 of the solar cell 11. The other end side of the connection member is connected through the solder layer (not shown) to the bus electrode section of the collecting electrode on the back surface side of the other interconnected solar cell 11.

Figure 3:
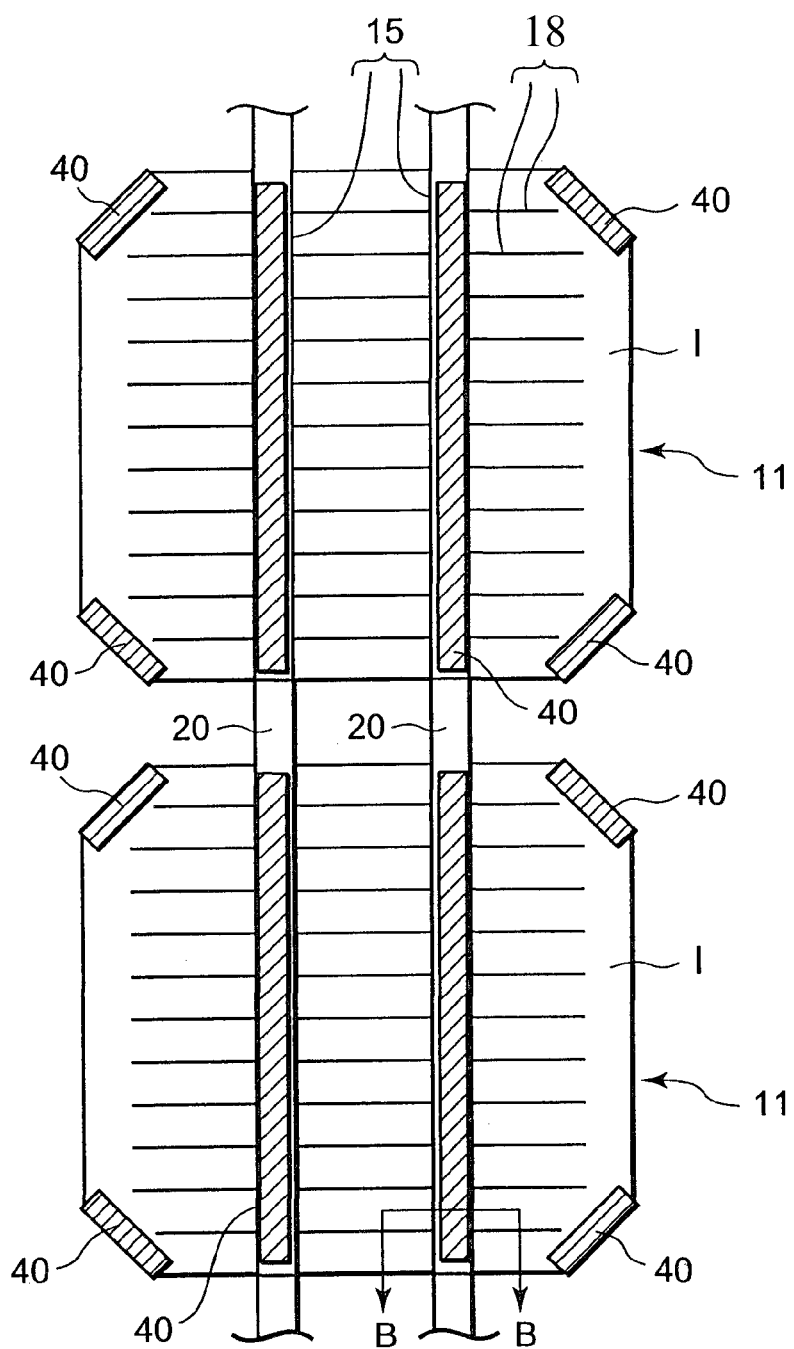
FIG. 3 is a main portion plan view showing electrically connected solar cells of the invention.

Next, description will be made of a light diffusion section 40 which is a feature of the embodiment. As shown in FIG. 3, the light diffusion section 40 is installed in the outer peripheral invalid region 1 positioned on the outer periphery of the solar cell 11, specifically in the invalid region 1 near a cut-off corner. Additionally, the light suffusion section 40 is installed in the connection member 20 connected to the bus electrode section 15 of the collecting electrode 16 located in the invalid region.

Figure 4:
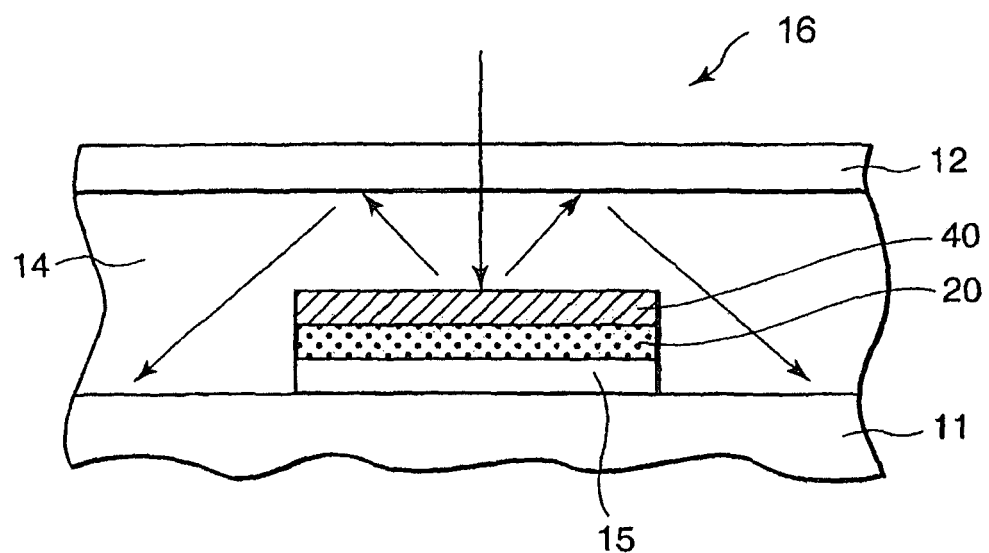
FIG. 4 is a sectional view of the embodiment of the invention equivalent to a section cut along the line B-B of FIG. 3.

For the light diffusion section 40. a white insulating resin sheet of polyethylene terephthalate (PEP). polyvinyl fluoride (PVF) or the like is cut to match a size of the invalid region, and then used. In such an insulating resin sheet, as a white color, the light receiving surface side is made rugged to diffuse and reflect an incident light. Incidentally, the light diffusion section 40 may be a white sheet of no ruggedness. The light diffusion section 40 may be made of a rugged-surface material of a high reflectance, e.g., an. aluminum material or the like. If the light diffusion section 40 made of such a metal material is arranged in the outer peripheral invalid region 1, an insulating material is preferably disposed between the solar cell 11 and the light diffusion section 40 in order to prevent electric conduction with the solar cell 11. As shown in FIG. 4, a reflected light (main optical path is indicated by an arrow in FIG. 4) is reflected on interfaces between the light penetrable sheet member 12 on the light receiving surface side and the sealing resin 14, and between the light penetrable sheet member 12 and air, and is incident on the light receiving surface of the solar cell 11, whereby output characteristics of the solar cell 11 and the solar battery module 10 are improved. Moreover, in the light diffusion section 40 arranged in the outer peripheral invalid region 1, an incident light is similarly diffused and reflected to improve output characteristics.

In place of the aforementioned light diffusion section 40, the light receiving surface of the connection member 20 made of the metal foil may be made rugged to be used as a light diffusion section.

The solar battery module of the embodiment can be fixed to a roof, a slope, an outer wall of a building or the like by disposing an outer frame made of a metal material such as aluminum on an outer periphery thereof. Additionally, the solar battery module can be fixed to the slope or the outer wall of the building by using an adhesive on the back surface side of the solar cell 11.

According to the present invention, since the light diffusion section is arranged in the invalid region of the solar cell, the reflected light is reflected again on the interfaces between the light penetrable sheet member on the light receiving surface side and the sealing resin, and between the light penetrable sheet member on the light receiving surface side and outside air, or the like, and is incident on the light receiving surface of the solar cell. As a result, it is possible to improve characteristics and to effectively use the incident light in the invalid region.

What is claimed is:

1. A solar battery module comprising:
   a light penetrable sheet member;
   a sheet member;
   a plurality of plate-like solar cells held between said light penetrable sheet member on a light receiving surface side and said sheet member on a back surface side being sealed by a sealing resin, the solar cells comprising a collecting electrode arranged on the light receiving surface and the back surface, the collecting electrode on the light receiving surface including two bus electrodes and a plurality of finger electrodes; and
   two connection members being metal foil extending in parallel along the bus electrode, each of the two connection members connected to the bus electrodes of the collecting electrodes through a conductive adhesive layer for electrically connecting the adjacent solar cells,
   wherein the two connection members each comprise a light diffusion section having a pigged surface for diffusely reflecting a light incident through the light penetrable sheet member, the light diffusion sections on the two connection members extend in parallel,
   wherein said rugged surface is located on top of said connection member and over said solar cell, and
   wherein a light reflected on the light diffusion section over the solar cell is reflected again on the light penetrable sheet member and is incident on the light receiving surface of the solar cell that is arranged on both sides of the bus electrode.

2. The solar battery module of claim 1, wherein the rugged surface material of the light diffusion section is a high reflectance and different from a material of the metal foil.

3. The solar battery module of claim 2, wherein the light diffusion section is an aluminum material.

4. The solar battery module of claim 3, wherein the conductive adhesive layer is solder layer.

5. The solar battery module of claim 2,
   wherein a light receiving surface side of the metal foil is entirely covered with the light diffusion section in a direction extending in a widthwise direction of the finger electrodes.

6. The solar battery module of claim 5, wherein the conductive adhesive layer is solder layer.

7. The solar battery module of claim 2, wherein the conductive adhesive layer is solder layer.

8. The solar battery module of claim 1, wherein the connection member extends from the collecting electrode arranged on the light receiving surface of one of the adjacent solar cells to the collecting electrode arranged on the back surface of the other of the adjacent solar cells.

9. The solar battery module of claim 8, wherein the connection member has a first surface comprising the light diffusion section and a second surface opposite to the first surface, and the collecting electrode arranged on the light receiving surface is connected to the second surface of the connection member and the collecting electrode arranged on the back surface is connected to the first surface of the connection member.

10. The solar battery module of claim 9, wherein the conductive adhesive layer is solder layer.

11. The solar battery module of claim 8, wherein a plurality of solar cells is arranged in a matrix between said light penetrable sheet member and said sheet member.

12. The solar battery module of claim 11, wherein the conductive adhesive layer is solder layer.

13. The solar battery module of claim 8, wherein the conductive adhesive layer is solder layer.

14. The solar battery module of claim 1,
   wherein a light reflected on the light diffusion section over the solar cell is reflected again on an interface between the light penetrable sheet member and air, and is incident on the light receiving surface of the solar cell.

15. The solar battery module of claim 14, wherein the conductive adhesive layer is solder layer.

16. The solar battery module of claim 1,
   wherein a light reflected on the light diffusion section over the solar cell is reflected again on an interface between the light penetrable sheet member and the sealing resin or an interface between the light penetrable sheet member and air, and is incident on the light receiving surface of the solar cell.

17. The solar battery module of claim 16, wherein the conductive adhesive layer is solder layer.

18. The solar battery module of claim 1, wherein the conductive adhesive layer is solder layer.

19. The solar battery module of claim 1, wherein said light reflected on the light penetrable sheet member is incident again on the light receiving surface of the solar cell that is arranged on both symmetrical position of the bus electrode.

20. A solar battery module comprising:
a light penetrable sheet member;
a sheet member;
a plurality of plate-like solar cells arranged in a matrix between said light penetrable sheet member on a light receiving surface side and said sheet member on a back surface side being sealed by a sealing resin, the solar cells comprising a plurality of a collecting electrode arranged on the light receiving surface and the back surface, the collecting electrode on the light receiving surface including two bus electrodes and a plurality of finger electrodes; and
two connection members being metal foil and extending in parallel along the bus electrodes, each of the two connection members connected to the bus electrodes of the collecting electrodes through a conductive adhesive layer for electrically connecting the adjacent solar cells,
wherein the connection member extends from the collecting electrode arranged on the light receiving surface of one of the adjacent solar cells to the collecting electrode arranged on the back surface of the other of the adjacent solar cells, and
the two connection members each comprise light diffusion section having a rugged surface for diffusely reflecting a light incident through the light penetrable sheet member, the light diffusion sections on the two connection members extend in parallel,
wherein said rugged surface is located on top of said connection member and over said solar cell, and
wherein a light reflected on the light diffusion section over the solar cell is reflected again on an interface between the light penetrable sheet member and the sealing resin, and is incident on the light receiving surface of the solar cell that is arranged on both sides of the bus electrode.

21. The solar battery module of claim 20, wherein the conductive adhesive layer is solder layer.

* * * * *

UNITED STATES PATENT AND TRADEMARK OFFICE
CERTIFICATE OF CORRECTION

PATENT NO. : 9,780,245 B2
APPLICATION NO. : 12/879431
DATED : October 3, 2017
INVENTOR(S) : Haga Page 1 of 1

It is certified that error appears in the above-identified patent and that said Letters Patent is hereby corrected as shown below:

Column 4, Line 7:
Change:
light diffusion section having a pigged surface for
To be:
light diffusion section having a rugged surface for Signed and Sealed this
Fourteenth Day of August, 2018

Andrei Iancu
*Director of the United States Patent and Trademark Office*